(12) United States Patent
Yun et al.

(10) Patent No.: US 7,633,324 B2
(45) Date of Patent: Dec. 15, 2009

(54) DATA OUTPUT STROBE SIGNAL GENERATING CIRCUIT AND SEMICONDUCTOR MEMORY APPARATUS HAVING THE SAME

(75) Inventors: Won-Joo Yun, Gyeonggi-do (KR); Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 128 days.

(21) Appl. No.: 11/878,074

(22) Filed: Jul. 20, 2007

(65) Prior Publication Data

US 2008/0164922 A1 Jul. 10, 2008

(30) Foreign Application Priority Data

Jan. 10, 2007 (KR) .................. 10-2007-0002747

(51) Int. Cl.
*H03L 7/00* (2006.01)
(52) U.S. Cl. .................. 327/160; 327/161; 327/175; 327/35; 331/17
(58) Field of Classification Search .......... None
See application file for complete search history.

(56) References Cited

U.S. PATENT DOCUMENTS

| | | | | |
|---|---|---|---|---|
| 5,220,216 A | * | 6/1993 | Woo | ............... 326/50 |
| 5,231,320 A | * | 7/1993 | Kase | ............... 327/277 |
| 6,570,815 B2 | | 5/2003 | Kashiwazaki | |
| 6,853,225 B2 | * | 2/2005 | Lee | ............... 327/158 |
| 6,940,768 B2 | | 9/2005 | Dahlberg et al. | |
| 6,967,514 B2 | * | 11/2005 | Kizer et al. | ............... 327/175 |
| 6,985,401 B2 | | 1/2006 | Jang et al. | |
| 7,068,549 B2 | | 6/2006 | Cho | |
| 7,224,625 B2 | | 5/2007 | Dietrich et al. | |
| 7,279,946 B2 | * | 10/2007 | Minzoni | ............... 327/158 |
| 7,417,480 B2 | * | 8/2008 | Boerstler et al. | ............... 327/175 |
| 7,477,715 B2 | * | 1/2009 | Byun et al. | ............... 375/373 |
| 7,535,270 B2 | * | 5/2009 | Lee et al. | ............... 327/147 |

FOREIGN PATENT DOCUMENTS

| | | |
|---|---|---|
| JP | 7227395 | 8/1995 |
| JP | 2002-042469 | 2/2002 |
| JP | 2002324398 | 11/2002 |
| JP | 2005332548 | 12/2005 |
| KR | 10-1999-0055781 | 7/1999 |
| KR | 1020040034984 | 4/2004 |

* cited by examiner

*Primary Examiner*—An T Luu
(74) *Attorney, Agent, or Firm*—Venable LLP; Jeffri A. Kaminski

(57) ABSTRACT

A data output strobe signal generating circuit includes a duty cycle correcting unit that corrects the duty ratio of an input clock in response to a control signal to generate a corrected clock. A data output strobe signal generating unit receives the corrected clock and generates a data output strobe signal. A duty cycle control unit receives the data output strobe signal and outputs the control signal.

29 Claims, 6 Drawing Sheets

DATA OUTPUT STROBE SIGNAL GENERATING CIRCUIT AND SEMICONDUCTOR MEMORY APPARATUS HAVING THE SAME

CROSS-REFERENCE TO RELATED PATENT APPLICATION

This application claims the benefit of Korean Patent Application No. 10-2007-0002747, filed on Jan. 10, 2007, in the Korean Intellectual Property Office, the disclosure of which is incorporated herein in its entirety by reference.

BACKGROUND OF THE INVENTION

1. Technical Field

The present invention relates to a data output strobe signal generating circuit and a semiconductor memory apparatus having the same, and more particularly, to a circuit for generating a data output strobe signal that is enabled at a correct timing and to a semiconductor memory apparatus having the same.

2. Related Art

In general, semiconductor memory apparatuses include data output buffers for a data output operation. The data output buffer outputs data transmitted through a global line in synchronization with a data output strobe signal. The data output strobe signal is generated from a clock having a high level at the rising edge timing of a DLL (delay locked loop) clock (hereinafter, referred to as a rising clock) or a clock having a high level at the falling edge timing of the DLL clock (hereinafter, referred to as a falling clock). In order to generate the data output strobe signal, the semiconductor memory apparatuses include data output strobe signal generating circuits.

In general, a DLL circuit generates a DLL clock having a phase that leads the phase of an external clock by a predetermined amount of time in order to compensate for the delay of a clock by internal delay elements provided in a semiconductor memory apparatus. The DLL circuit divides the DLL clock into a rising clock and a falling clock and adjusts the duty ratio of each of the clocks to 50:50. Therefore, ideally, the duty ratio of each of the rising clock and the falling clock transmitted to the data output strobe signal generating circuit should be 50:50. However, actually, the duty ratio of each of the rising clock and the falling clock varies due to resistance and noise existing on a clock transmitting line. If the data output strobe signal is generated under the conditions when the duty ratio of each of the rising clock and the falling clock is not 50:50, an enable period of the data output strobe signal varies, which makes it difficult to exactly control the operation of the data output buffer. At worst, a data output operation may not be performed.

However, the data output strobe signal generating circuit of the semiconductor memory apparatus according to the related art generates the data output strobe signal from the rising clock and the falling clock that do not have a correct duty ratio. Therefore, it is difficult for the data output strobe signal generating circuit to generate a data output strobe signal having a correct enable period. As a result, the semiconductor memory apparatus is more likely to operate erroneously during data output, which makes it difficult to perform a correct data output operation. That is, the reliability of the data output operation of the semiconductor memory apparatus is lowered.

SUMMARY OF THE INVENTION

Embodiments of the present invention provide a data output strobe signal generating circuit capable of improving the reliability of a data output operation and a semiconductor memory apparatus having the same.

An embodiment of the present invention provides a data output strobe signal generating circuit including: a duty cycle correcting unit configured to correct a duty cycle of an input clock in response to a control signal, thereby outputting a corrected clock; a data output strobe signal generating unit configured to receive the corrected clock, thereby generating a data output strobe signal; and a duty cycle control unit configured to receive the data output strobe signal, thereby outputting the control signal.

Another embodiment of the present invention provides a semiconductor memory apparatus including: a DLL circuit configured to generate a DLL clock having a phase which leads the phase of an external clock by a predetermined amount of time; a transmission line configured to transmit the DLL clock; a data output strobe signal generating circuit configured to correct a duty cycle of the DLL clock transmitted through the transmission line, thereby generating a data output strobe signal using the corrected clock; and a data output buffer configured to receive the data output strobe signal, thereby buffering output data.

Still another embodiment of the present invention provides a method of generating a data output strobe signal including: correcting a duty ratio of an input clock in response to a control signal to generate a corrected clock; generating a data output strobe signal from the corrected clock; and receiving the data output strobe signal, thereby outputting the control signal.

Yet another embodiment of the present invention provides a method of controlling a semiconductor memory apparatus including: generating a DLL clock having a phase which leads the phase of an external clock by a predetermined amount of time; correcting a duty cycle of the DLL clock and generating a data output strobe signal using the corrected clock; and receiving the data output strobe signal and buffering output data.

DESCRIPTION OF EXEMPLARY EMBODIMENT

Exemplary embodiments of the present invention will now be described in detail with reference to the accompanying drawings.

Figure 1:
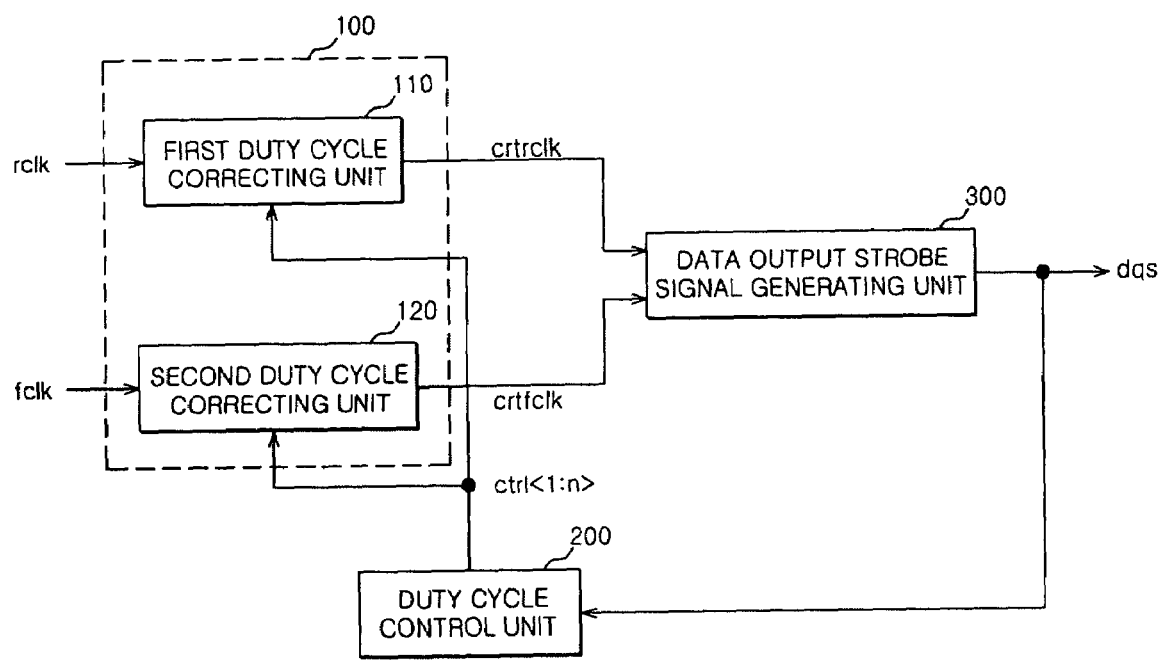
FIG. 1 is a block diagram illustrating the structure of a data output strobe signal generating circuit according to an embodiment of the present invention.

As shown in FIG. 1, a data output strobe signal generating circuit includes a duty cycle correcting unit 100, a duty cycle control unit 200, and a data output strobe signal generating unit 300.

The duty cycle correcting unit 100 corrects the duty ratios of a rising clock rclk and a falling clock fclk in response to n control signals ctrl<1:n> and outputs a corrected rising clock crtrclk and a corrected falling clock crtfclk.

The duty cycle correcting unit 100 includes a first duty cycle correcting unit 110 and a second duty cycle correcting unit 120.

The first duty cycle correcting unit 110 corrects the duty ratio of the rising clock rclk in response to the n control signals ctrl<1:n> and outputs the corrected rising clock crtrclk. The second duty cycle correcting unit 120 corrects the duty ratio of the falling clock fclk in response to the n control signals ctrl<1:n> and outputs the corrected falling clock crtfclk.

The first duty cycle correcting unit 110 and the second duty cycle correcting unit 120 control the duty ratios of the rising clock rclk and the falling clock fclk according to the number of high-level signals and the number of low-level signals among the n control signals ctrl<1:n>, respectively. For example, as the number of high-level signals among the n control signals ctrl<1:n> increases, the first duty cycle correcting unit 110 widens the period in which the rising clock rclk is at a high level and narrows the period in which the rising clock rclk is at a low level, and the second duty cycle correcting unit 120 widens the period in which the falling clock fclk is at a low level and narrows the period in which the falling clock fclk is at a high level. Similarly, as the number of low-level signals among the n control signals ctrl<1:n> increases, the first duty cycle correcting unit 110 widens the period in which the rising clock rclk is at a low level and narrows the period in which the rising clock rclk is at a high level, and the second duty cycle correcting unit 120 widens the period in which the falling clock fclk is at a high level and narrows the period in which the falling clock fclk is at a low level.

The duty cycle control unit 200 receives a data output strobe signal dqs and outputs the n control signals. The duty cycle control unit 200 includes a feedback loop to determine the duty ratio of the data output strobe signal dqs, and generates the n control signals ctrl<1:n> on the basis of the result of the determination. The duty ratio of the data output strobe signal dqs is affected by the corrected rising clock crtrclk or the corrected falling clock crtfclk. Therefore, if the duty ratio of each of the corrected rising clock crtrclk and the corrected falling clock crtfclk is not 50:50, the duty ratio of the data output strobe signal dqs is not 50:50. Thus, if the duty cycle control unit 200 determines the duty ratio of the data output strobe signal dqs and generates the n control signals ctrl<1:n>, the duty ratio of the corrected rising clock crtrclk to the corrected falling clock crtfclk is adjusted to 50:50 by the n control signals ctrl<1:n>.

The operation of the duty cycle control unit 200 will be described in detail below with reference to FIG. 3.

The data output strobe signal generating unit 300 generates the data output strobe signal dqs from the corrected rising signal crtrclk and the corrected falling signal crtfclk.

Figure 2A:
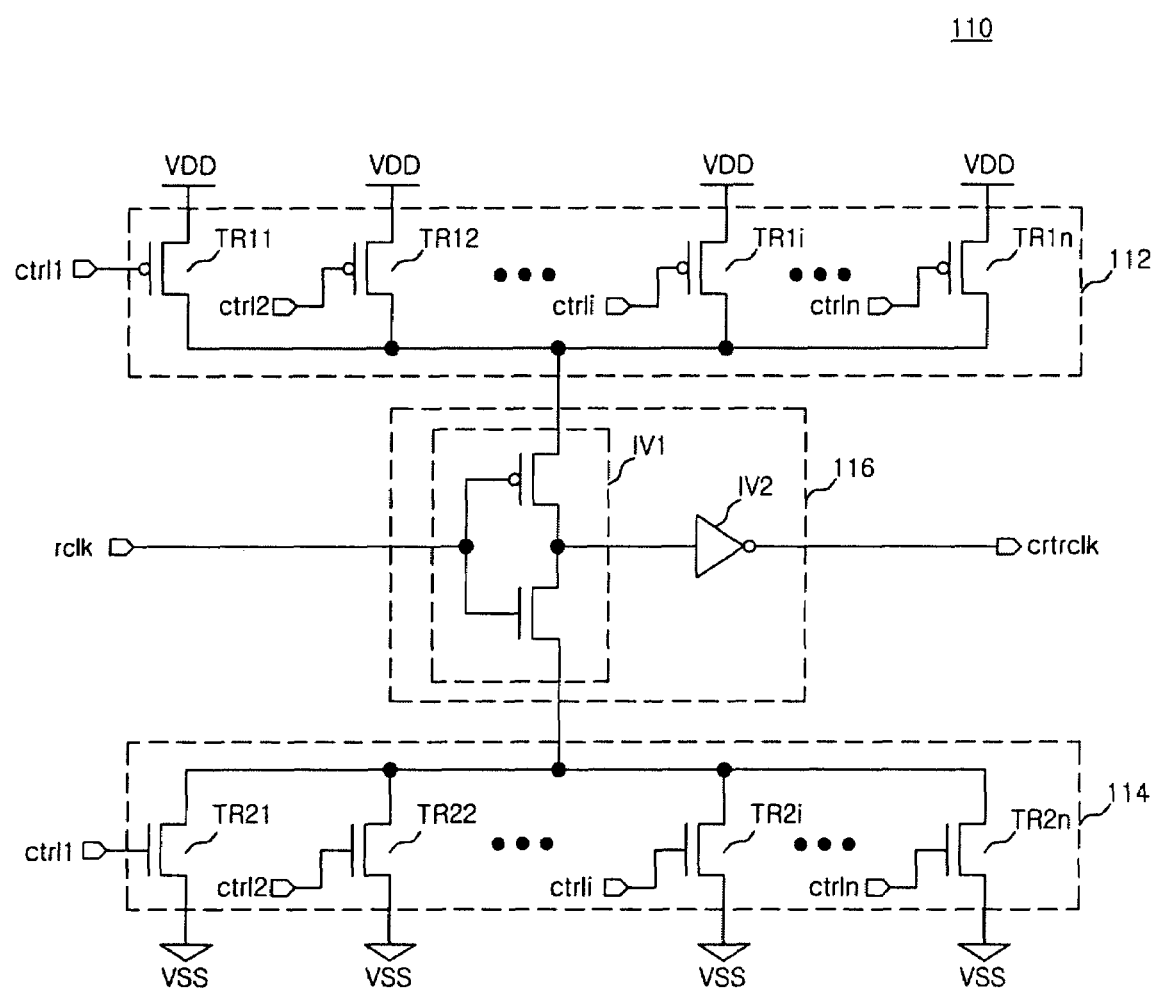
FIG. 2A is a diagram illustrating the detailed structure of a first duty cycle correcting unit shown in FIG. 1.

Referring to FIG. 2A, the first duty cycle correcting unit 110 includes a pull-up unit 112, a pull-down unit 114, and a driving unit 116.

The pull-up unit 112 controls the supply of an external power supply voltage VDD to the driving unit 116 in response to the n control signals ctrl<1:n>. The pull-up unit 112 includes n first transistors TR1<1:n> which are connected in parallel to each other between an external power supply voltage VDD terminal and the driving unit 116. Each of the n first transistors TR1<1:n> has a gate which receives a respective one of the n control signals.

The pull-down unit 114 controls the supply of a ground voltage VSS to the driving unit 116 in response to the n control signals ctrl<1:n>. The pull-down unit 114 includes n second transistors TR2<1:n> which are connected in parallel to each other between a ground power supply voltage VSS terminal and the driving unit 116. Each of the n second transistors TR2<1:n> has a gate which receives a respective one of the n control signals.

The driving unit 116 is supplied with power from the pull-up unit 112 and the pull-down unit 114, drives the rising clock rclk, and outputs the corrected rising clock crtrclk. The driving unit 116 includes a first inverter IV1 that is supplied with power from the pull-up unit 112 and the pull-down unit 114 and receives the rising clock rclk, and a second inverter IV2 that receives an output signal of the first inverter IV1 and outputs the corrected rising clock crtrclk.

By this structure, the driving unit 116 corrects the duty ratio of the rising clock rclk. That is, when the number of low-level signals among the n control signals ctrl<1:n> increases, the pull-up unit 112 increases the amount of power supplied to the first inverter IV1 of the driving unit 116, so that the period in which the output signal of the first inverter IV1 is at a high level is widened. The period in which the corrected rising clock crtrclk output from the second inverter IV2 is at a low level is widened.

On the other hand, when the number of high-level signals among the n control signals ctrl<1:n> increases, the pull-down unit 114 increases the amount of power supplied to the first inverter IV1 of the driving unit 116, so that the period in which the output signal of the first inverter IV1 is at a low level is widened. The period in which the corrected rising clock crtrclk output from the second inverter IV2 is at a high level is widened.

Figure 2B:
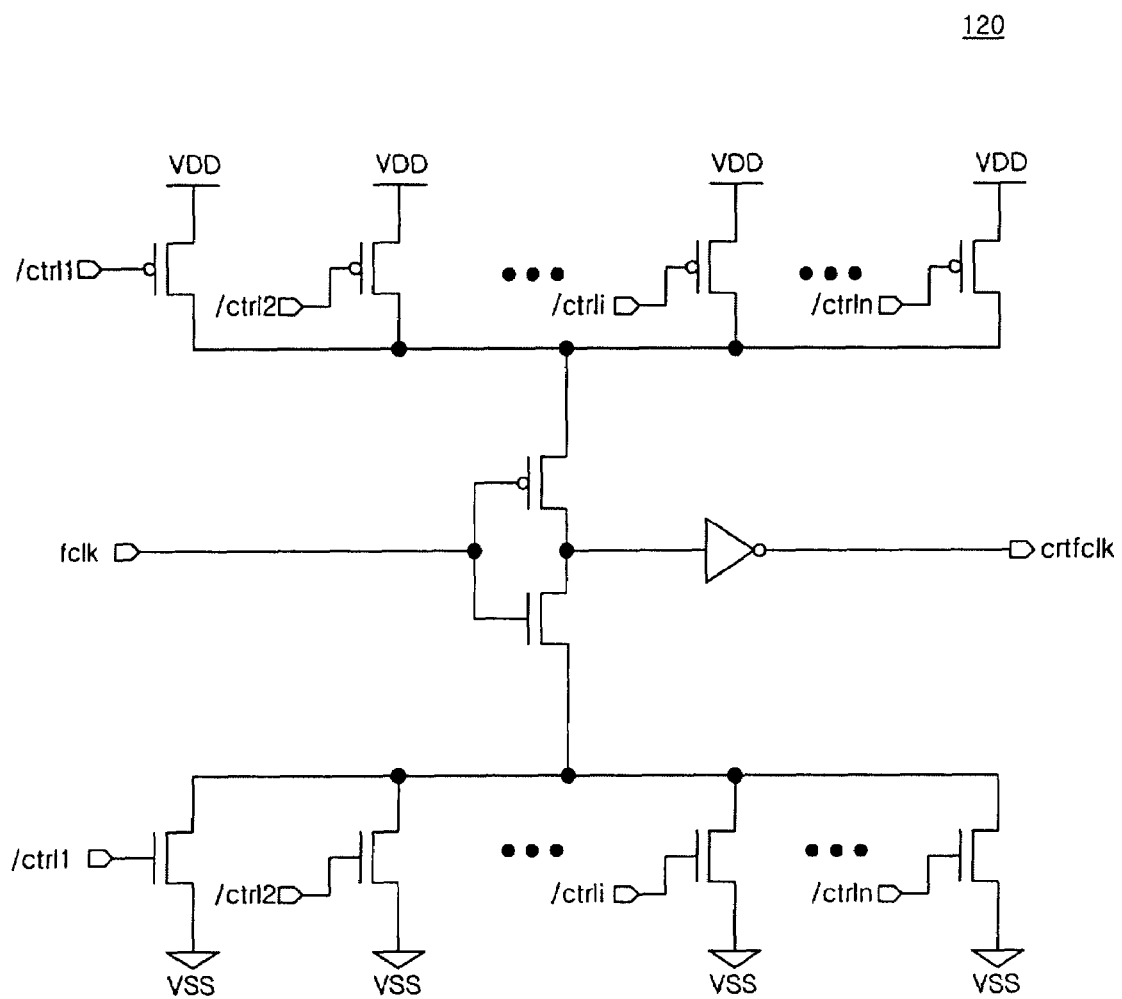
FIG. 2B is a diagram illustrating the detailed structure of a second duty cycle correcting unit shown in FIG. 1.

As shown in FIG. 2B, the structure of the second duty cycle correcting unit 120 is similar to that of the first duty cycle correcting unit 110 except that it receives the falling clock fclk instead of the rising clock rclk, operates according to inverted signals /crtl<1:n> of the n control signals ctrl<1:n>, and outputs the corrected falling clock crtfclk instead of the corrected rising clock crtrclk.

Therefore, when the number of low-level signals among the n control signals ctrl<1:n> increases, the period in which the corrected falling clock crtfclk is at a high level is widened. When the number of high-level signals among the n control signals ctrl<1:n> increases, the period in which the corrected falling clock crtfclk is at a low level is widened.

Figure 3:
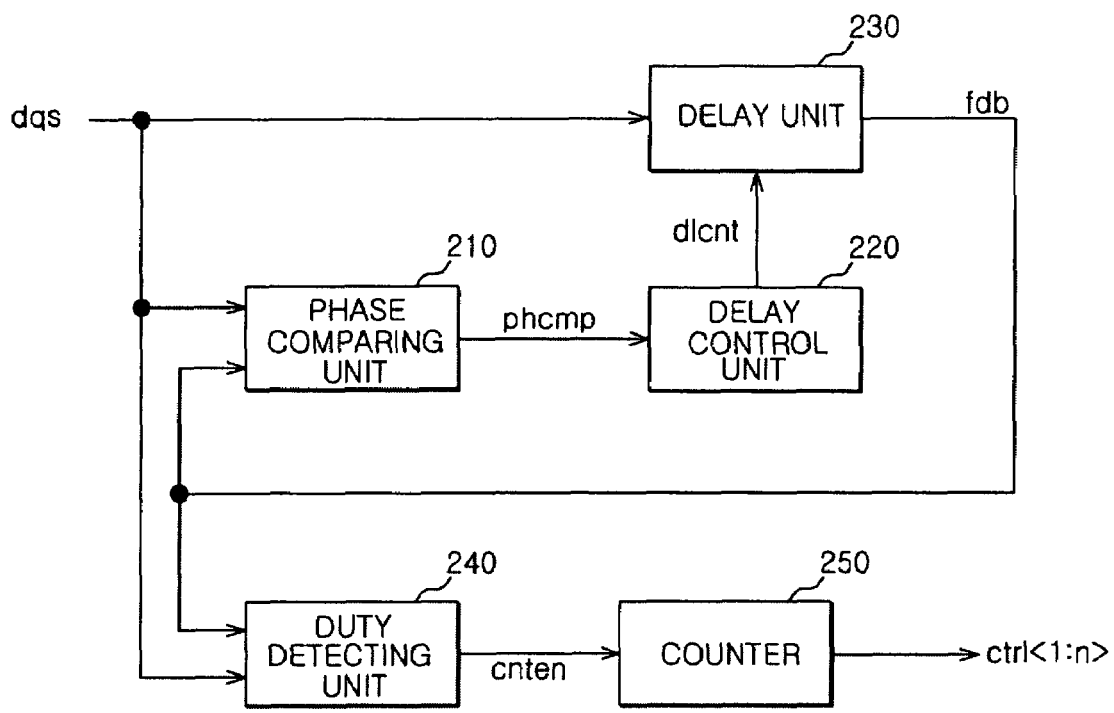
FIG. 3 is a diagram illustrating the detailed structure of a duty cycle control unit shown in FIG. 1.

Referring to FIG. 3, the duty cycle control unit 200 includes a phase comparing unit 210, a delay control unit 220, a delay unit 230, a duty detecting unit 240, and a counter 250.

If the duty ratio of each of the rising clock rclk and the falling clock fclk is not 50:50, the duty ratio of the data output strobe signal dqs is not 50:50. The phase comparing unit 210 compares the phase of the data output strobe signal dqs with the phase of the feedback signal fdb that is delayed and inverted from the data output strobe signal dqs to generate a phase comparison signal phcmp. The phase comparison signal phcmp includes information on the rising edge timings of the data output strobe signal dqs and the feedback signal fdb.

The delay control unit 220 generates a delay control signal dlcnt in response to the phase comparison signal phcmp.

The delay unit 230 delays the data output strobe signal dqs by a time corresponding to the delay control signal dlcnt, and inverts the delayed signal to generate the feedback signal fdb.

That is, when the phase comparison signal phcmp is enabled, the delay control unit 220 and the delay unit 230 delay the data output strobe signal dqs by a predetermined amount of time.

The duty detecting unit 240 receives the data output strobe signal dqs and the feedback signal fdb, inverts the received signals, and compares the phases of the inverted signals to generate a counting enable signal cnten.

The counter 250 generates the n control signals ctrl<1:n> in response to the counting enable signal cnten.

The delay control unit 220 and the delay unit 230 match the rising edge timing of the data output strobe signal dqs with the rising edge timing of the feedback signal fdb gradually. Inverted signals of the data output strobe signal dqs and the feedback signal fdb are input to the duty detecting unit 240, and the falling edge timings of the data output strobe signal dqs and the feedback signal fdb are matched with each other in the duty detecting unit 240 gradually. Then, the duty detecting unit 240 compares the rising edge timings of the two signals and enables the counting enable signal cnten according to the result of the comparison. The counter 250 changes the logical values of the n control signals ctrl<1:n> until the rising edge of the inverted data output strobe signal dqs is matched with the rising edge of the inverted feedback signal fdb. In this way, the duty ratio of the data output strobe signal dqs is matched with the duty ratio of the feedback signal fdb gradually, and the duty ratio of the corrected rising clock crtrclk is matched with the duty ratio of the corrected falling clock crtfclk gradually. Consequently, the duty ratio of the data output strobe signal dqs is corrected.

Preferably, the operation of the duty cycle control unit 200 can be realized through a test mode. That is, in the test mode, the data output strobe signal dqs having the same waveform as the rising clock rclk or the falling clock fclk is generated, and the generated signal is input to the duty cycle control unit 200 to extract an appropriate combination of the n control signals ctrl<1:n>. At that time, it is also possible to control the duty ratios of the corrected rising clock crtrclk and the corrected falling clock crtfclk by fixing the n control signals ctrl<1:n> using, for example, a fuse circuit and then supplying the fixed signals to the first duty cycle correcting unit 110 and the second duty cycle correcting unit 120.

Figure 4:
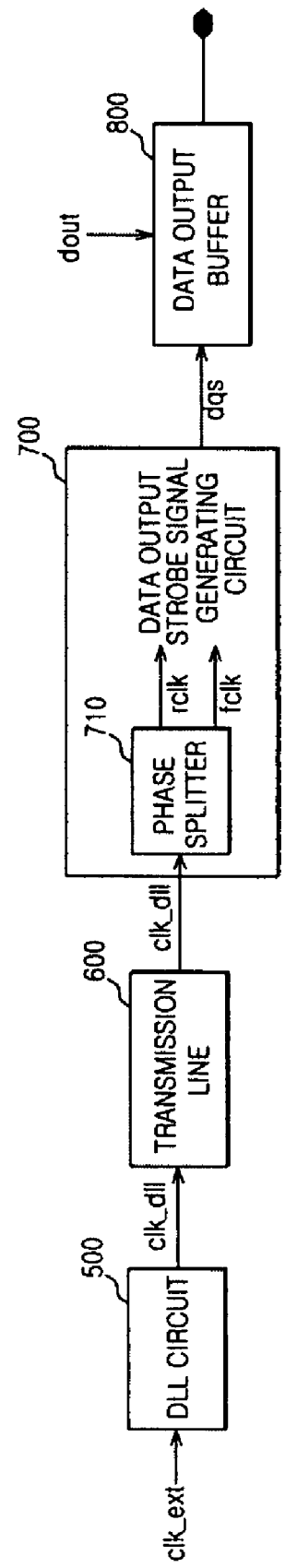
FIG. 4 is a block diagram illustrating the structure of a semiconductor memory apparatus according to another embodiment of the present invention.

Referring to FIG. 4, a semiconductor memory apparatus according to an embodiment of the present invention includes a DLL circuit 500, a transmission line 600, a data output strobe signal generating circuit 700, and a data output buffer 800.

The DLL circuit 500 generates a DLL clock clk_dll that leads an external clock clk_ext by a predetermined amount of time.

The transmission line 600 transmits the DLL clock clk_dll.

The data output strobe signal generating circuit 700 corrects the duty cycle of the DLL clock clk_dll transmitted through the transmission line 600 to generate a data output strobe signal dqs. The data output strobe signal generating circuit 700 includes a phase splitter 710 that directly receives the DLL clock clk_dll whose duty cycle is not corrected, and divides the received DLL clock clk_dll to generate a rising clock rclk and a falling clock fclk. The configuration and method of correcting the duty ratios of the rising clock rclk and the falling clock fclk output from the phase splitter 710 to generate the data output strobe signal dqs have been described with reference to FIG. 1.

The data output buffer 800 receives the data output strobe signal dqs and buffers an output data dout.

In the embodiment shown in FIG. 1, the phases of the rising clock rclk and the falling clock fclk input to the data output strobe signal generating circuit may not be exactly opposite to each other. Meanwhile, in the embodiment shown in FIG. 4, since the data output strobe signal generating unit includes the phase splitter 710, the phases of the rising clock rclk and the falling clock fclk input to the data output strobe signal generating circuit are exactly opposite to each other. Therefore, the reliability of an operation of correcting the duty cycles of the rising clock rclk and the falling clock fclk can be further improved.

Figure 5:
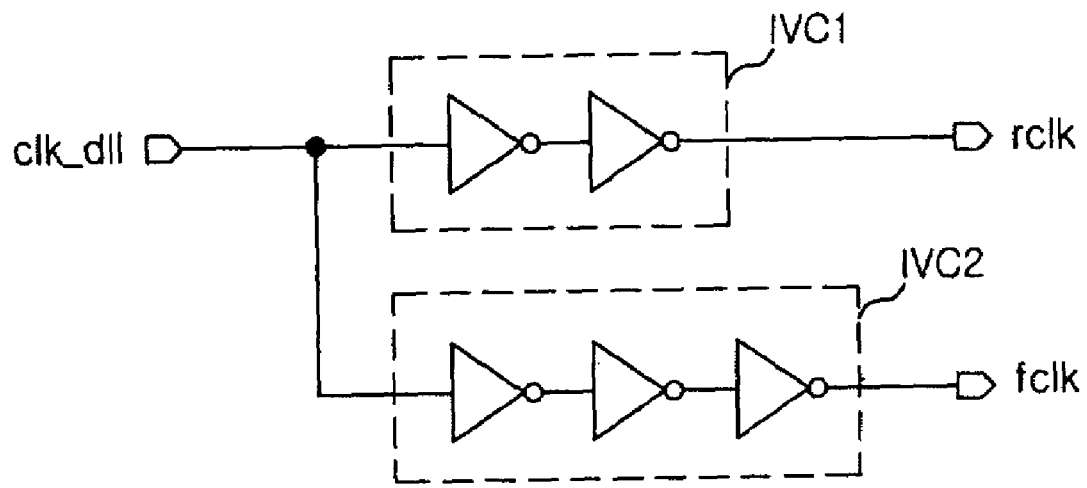
FIG. 5 is a diagram illustrating the detailed structure of a phase splitter shown in FIG. 4.

Referring to FIG. 5, the phase splitter 710 includes a first inverter chain IVC1 that has an even-number of inverters connected in series to each other to non-invert the DLL clock clk_dll, and a second inverter chain IVC2 that has an odd-number of inverter(s) connected in series to each other to invert the DLL clock clk_dll.

As described above, the data output strobe signal generating circuit of the semiconductor memory apparatus according to an embodiment of the present invention determines the duty ratio of the data output strobe signal to generate a control signal and corrects the duty ratios of the rising clock and the falling clock using the generated control signal. Therefore, the data output strobe signal generating circuit can generate a data output strobe signal having an exact enable period. That is, since the data output strobe signal generating circuit generates a data output strobe signal using the rising clock and the falling clock each having a duty ratio of 50:50, the data output strobe signal generating circuit is less likely to erroneously operate during a data output operation, which makes it possible for a semiconductor memory apparatus to output data with high reliability.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, according to the above-mentioned embodiments of the present invention, the data output strobe signal generating circuit and the semiconductor memory apparatus having the same correct the duty ratio of an input clock to generate a corrected clock and use the corrected clock to generate a data output strobe signal, which makes it possible to improve the reliability of a data output operation.

Further, according to the above-mentioned embodiments of the present invention, the data output strobe signal generating circuit and the semiconductor memory apparatus having the same divide a DLL clock to generate a rising clock and a falling clock, correct the duty ratios of the rising clock and the falling clock to generate a data output strobe signal. Therefore, it is possible to generate a data output strobe signal having an exact enable period.

What is claimed is:

1. A data output strobe signal generating circuit comprising:
   a duty cycle correcting unit configured to correct a duty cycle of an input clock in response to a control signal, thereby outputting a corrected clock;
   a data output strobe signal generating unit configured to receive the corrected clock, thereby generating a data output strobe signal; and
   a duty cycle control unit configured to receive the data output strobe signal, thereby outputting the control signal, wherein the duty cycle control unit includes a feedback loop to generate a feedback signal by delaying the data output strobe signal, determine a duty ratio of the data output strobe signal using the feedback signal comparing a phase of the data output strobe signal with a phase of the feedback signal, and increases/decreases logical values of a plurality of signals based on the duty ratio to output the plurality of the signals as the control signal.

2. The data output strobe signal generating circuit of claim 1,
   wherein
   the duty cycle correcting unit is configured to correct the duty cycle of the input clock according to a number of high-level signals and a number of low-level signals included in the control signal.

3. The data output strobe signal generating circuit of claim 2,
   wherein the duty cycle correcting unit comprises:
   a pull-up unit configured to control an external power supply voltage in response to the control signal;
   a pull-down unit configured to control a ground power supply voltage in response to the control signal; and
   a driving unit configured to receive the voltage from the pull-up unit and the pull-down unit and to drive the input clock based thereon, thereby outputting the corrected clock.

4. The data output strobe signal generating circuit of claim 3,
   wherein the pull-up unit comprises a plurality of transistors connected in parallel to each other between an external power supply voltage terminal and the driving unit; and
   wherein each of the transistors has a gate which receives a respective one of the signals included in the control signal.

5. The data output strobe signal generating circuit of claim 3,
   wherein the pull-down unit comprises a plurality of transistors connected in parallel to each other between a ground power supply voltage terminal and the driving unit; and
   wherein each of the transistors has a gate which receives a respective one of the signals included in the control signal.

6. The data output strobe signal generating circuit of claim 3,
   wherein the driving unit comprises:
   a first inverter that is supplied with the voltage from the pull-up unit and the pull-down unit and receives the input clock to provide an output signal; and
   a second inverter that receives the output signal of the first inverter and outputs the corrected clock.

7. The data output strobe signal generating circuit of claim 1,
   wherein the duty cycle control unit comprises:
   a phase comparing unit configured to compare a phase of the data output strobe signal with a phase of the feedback signal to generate a phase comparison signal;
   a delay control unit configured to generate a delay control signal in response to the phase comparison signal;
   a delay unit configured to delay the data output strobe signal by a time corresponding to the delay control signal to obtain a delayed signal and to invert the delayed signal, to generate the feedback signal;
   a duty detecting unit configured to invert the data output strobe signal and the feedback signal to obtain inverted signals and to compare the phases of the inverted signals to generate a counting enable signal; and
   a counter configured to generate the control signal in response to the counting enable signal.

8. The data output strobe signal generating circuit of claim 7,
   wherein the phase comparing unit is configured to output the phase comparison signal including information on rising edge timings of the data output strobe signal and the feedback signal.

9. The data output strobe signal generating circuit of claim 7,
   wherein the duty detecting unit is configured to compare rising edges of the inverted signals and to enable the counting enable signal according to a result of the comparison.

10. The data output strobe signal generating circuit of claim 7,
    wherein, when the counting enable signal is enabled, the counter is configured to change a number of high-level signals included in the control signal.

11. A semiconductor memory apparatus comprising:
    a DLL circuit configured to generate a DLL clock having a phase which leads a phase of an external clock by a predetermined amount of time in order to compensate for a delay of a clock by internal delay elements provided in the semiconductor memory apparatus;
    a transmission line configured to transmit the DLL clock;
    a data output strobe signal generating circuit configured to correct a duty cycle of the DLL clock transmitted through the transmission line to obtain a corrected clock, thereby generating a data output strobe signal using the corrected clock; and
    a data output buffer configured to receive the data output strobe signal, thereby buffering output data wherein the data output strobe signal generating circuit comprises:
    a phase splitter configured to divide the DLL clock to generate a rising clock and a falling clock;
    a first duty cycle correcting unit configured to correct a duty ratio of the rising clock in response to a control signal to output a corrected rising clock;
    a second duty cycle correcting unit configured to correct a duty ratio of the falling clock in response to the control signal to output a corrected falling clock;
    a data output strobe signal generating unit configured to receive the corrected rising clock and the corrected falling clock, thereby generating the data output strobe signal; and
    a duty cycle control unit configured to receive the data output strobe signal, thereby outputting the control signal.

12. The semiconductor memory apparatus of claim 11,
wherein the control signal is composed of a combination of a plurality of signals, and
the first and second duty cycle correcting units are configured to correct the duty ratios of the rising clock and the falling clock according to a number of high-level signals and a number of low-level signals included in the control signal, respectively.

13. The semiconductor memory apparatus of claim 12,
wherein the first duty cycle correcting unit comprises:
a pull-up unit configured to control an external power supply voltage in response to the control signal;
a pull-down unit configured to control a ground power supply voltage in response to the control signal; and
a driving unit configured to receive the voltage from the pull-up unit and the pull-down unit and to drive the rising clock, thereby outputting the corrected rising clock.

14. The semiconductor memory apparatus of claim 12,
wherein the second duty cycle correcting unit comprises:
a pull-up unit configured to control an external power supply voltage in response to the control signal;
a pull-down unit configured to control the supply of a ground power supply voltage in response to an inverted signal of the control signal; and
a driving unit configured to receive the voltage from the pull-up unit and the pull-down unit and to drive the falling clock, thereby outputting the corrected falling clock.

15. The semiconductor memory apparatus of claim 11,
wherein the duty cycle control unit comprises a feedback loop to determine a duty ratio of the data output strobe signal, and increases/decreases logical values of a plurality of signals on the basis of a result of the determination to generate the control signal.

16. The semiconductor memory apparatus of claim 11,
wherein the duty cycle control unit comprises:
a phase comparing unit configured to compare a phase of the data output strobe signal with a phase of a feedback signal to generate a phase comparison signal;
a delay control unit configured to generate a delay control signal in response to the phase comparison signal;
a delay unit configured to delay the data output strobe signal by a time corresponding to the delay control signal to obtain a delayed signal and to invert the delayed signal to generate the feedback signal;
a duty detecting unit configured to invert the data output strobe signal and the feedback signal to obtain inverted signals and to compare the phases of the inverted signals to generate a counting enable signal; and
a counter configured to generate the control signal in response to the counting enable signal.

17. A method of generating a data output strobe signal, comprising:
correcting a duty ratio of an input clock in response to a control signal to generate a corrected clock;
generating a data output strobe signal from the corrected clock; and
receiving the data output strobe signal, thereby outputting the control signal,
wherein the outputting of the control signal comprises:
generating a feedback signal by delaying the data output strobe signal, determining an enabling timing of the data output strobe signal using the feedback signal comparing a phase of the data output strobe signal with a phase of the feedback signal, and increasing/decreasing logical values of a plurality of signals on the basis of a result of the determination to output the plurality of the signals as the control signals.

18. The method of claim 17,
wherein the generating of the corrected clock corrects the duty ratio of the input clock according to a number of high-level signals and a number of low-level signals included in the control signal.

19. The method of claim 17,
wherein the outputting of the control signal comprises:
comparing a phase of the data output strobe signal with a phase of the feedback signal to generate a phase comparison signal;
generating a delay control signal in response to the phase comparison signal;
delaying the data output strobe signal by a time corresponding to the delay control signal to obtain a delayed signal, and inverting the delayed signal to generate the feedback signal;
inverting the data output strobe signal and the feedback signal to obtain inverted signals and comparing phases of the inverted signals to generate a counting enable signal; and
generating the control signal in response to the counting enable signal.

20. The method of claim 19,
wherein the comparing of the phases outputs the phase comparison signal including information on rising edge timings of the data output strobe signal and the feedback signal.

21. The method of claim 19,
wherein the generating of the counting enable signal comprises:
comparing rising edges of the inverted signals; and
enabling the counting enable signal according to a result of the comparison.

22. The method of claim 19,
wherein, when the counting enable signal is enabled, the generating of the control signal changes a number of high-level signals included in the control signal.

23. A method of controlling a semiconductor memory apparatus, comprising:
generating a DLL clock having a phase which leads a phase of an external clock by a predetermined amount of time in order to compensate for a delay of a clock by internal delay elements provided in the semiconductor memory apparatus;
correcting a duty cycle of the DLL clock to obtain a corrected clock and output strobe signal using the corrected clock; and
receiving the data output strobe signal and buffering output data, wherein the generating of the data output strobe signal comprises:
dividing the DLL clock to generate a rising clock and a falling clock having duty ratios;
correcting the duty ratios of the rising and the falling clock to generate a corrected rising clock and a corrected falling clock on the basis of the control signal, respectively;
receiving the corrected rising clock and the corrected falling clock, thereby generating a data output strobe signal; and
receiving the data output strobe signal, thereby outputting the control signal.

24. The method of claim 23,
wherein the control signal is composed of a combination of a plurality of signals, and wherein the generating of the corrected rising clock and the corrected falling clock corrects the duty ratios of the rising clock and the falling clock according to a number of high-level signals and a number of low-level signals included in the control signal, respectively.

25. The method of claim 24,
wherein the outputting of the control signal includes determining a duty ratio of the data output strobe signal using a feedback loop, and increasing/decreasing logical values of the plurality of signals on the basis of a result of the determination to generate the control signal.

26. The method of claim 23,
wherein the outputting of the control signal comprises:
comparing a phase of the data output strobe signal with a phase of a feedback signal to generate a phase comparison signal;
generating a delay control signal in response to the phase comparison signal;
delaying the data output strobe signal by a time corresponding to the delay control signal to obtain a delayed signal, and inverting the delayed signal to generate the feedback signal;
inverting the data output strobe signal and the feedback signal to obtain inverted signals and comparing phases of the inverted signals to generate a counting enable signal; and
generating the control signal in response to the counting enable signal.

27. The method of claim 26,
wherein the comparing of the phases includes outputting the phase comparison signal including information on rising edge timings of the data output strobe signal and the feedback signal.

28. The method of claim 26,
wherein the generating of the counting enable signal comprises:
comparing rising edges of the inverted signals; and
enabling the counting enable signal according to a result of the comparison.

29. The method of claim 26,
wherein, when the counting enable signal is enabled, the generating of the control signal changes a number of high-level signals included in the control signal.

* * * * *